(12) United States Patent
Otsuka et al.

(10) Patent No.: US 7,745,850 B2
(45) Date of Patent: Jun. 29, 2010

(54) NITRIDE-BASED SEMICONDUCTOR DEVICE WITH REDUCED LEAKAGE CURRENT

(75) Inventors: Koji Otsuka, Niiza (JP); Emiko Chino, Niiza (JP); Masataka Yanagihara, Niiza (JP)

(73) Assignee: Sanken Electric Co., Ltd. (JP)

( * ) Notice: Subject to any disclaimer, the term of this patent is extended or adjusted under 35 U.S.C. 154(b) by 945 days.

(21) Appl. No.: 11/341,276

(22) Filed: Jan. 27, 2006

(65) Prior Publication Data

US 2006/0118824 A1 Jun. 8, 2006

Related U.S. Application Data (63) Continuation of application No. PCT/JP2004/011058, filed on Aug. 2, 2004.

(30) Foreign Application Priority Data

Aug. 8, 2003 (JP) ............................... 2003-289983

(51) Int. Cl.
*H01L 29/20* (2006.01)
(52) U.S. Cl. .................. 257/194; 257/189; 257/190; 257/615
(58) Field of Classification Search ................ 257/189, 257/190, 194, 615
See application file for complete search history.

(56) References Cited

U.S. PATENT DOCUMENTS

| | | | | |
|---|---|---|---|---|
| 5,023,686 A * | 6/1991 | Helmut et al. | ............... | 257/257 |
| 5,567,961 A * | 10/1996 | Usagawa et al. | ............ | 257/197 |
| 5,693,963 A * | 12/1997 | Fujimoto et al. | ............... | 257/94 |
| 5,798,537 A * | 8/1998 | Nitta | ........................... | 257/103 |
| 6,127,716 A * | 10/2000 | Morizuka et al. | ........... | 257/503 |
| 6,686,616 B1 * | 2/2004 | Allen et al. | .................. | 257/280 |
| 7,030,428 B2 * | 4/2006 | Saxler | ........................ | 257/194 |
| 7,053,417 B2 * | 5/2006 | Kim | ............................ | 257/94 |
| 2003/0080331 A1 * | 5/2003 | Ono et al. | ..................... | 257/14 |
| 2004/0012013 A1 * | 1/2004 | Katayama | .................... | 257/13 |
| 2004/0061129 A1 * | 4/2004 | Saxler et al. | ................ | 257/192 |
| 2004/0099888 A1 * | 5/2004 | Sriram | ....................... | 257/288 |
| 2004/0150002 A1 * | 8/2004 | Grein et al. | .................. | 257/184 |

FOREIGN PATENT DOCUMENTS

JP 2003-059948 2/2003

OTHER PUBLICATIONS

Katzer, D.S. et al., "Molecular Beam Epitaxy of Beryllium-Doped GaN Buffer Layers for AlGaN/GaN HEMTs", *Journal of Crystal Growth*, 2003, 251, 481-486.

Storm, D.F. et al., "Reduction of Buffer Layer Conduction near Plasma-Assisted Molecular-Beam Epitaxy Grown GaN/AlN Interfaces by Beryllium Doping", *Applied Physics Letters*, 2002, 81(20), 3819-3821.

* cited by examiner

*Primary Examiner*—Matthew C Landau
*Assistant Examiner*—James M Mitchell
(74) *Attorney, Agent, or Firm*—Woodcock Washburn LLP (57) ABSTRACT

A high electron mobility transistor is disclosed which has a triple-layered main semiconductor region formed on a silicon substrate via a multilayered buffer region. The multilayered buffer region is in the form of alternations of an aluminum nitride layer and a gallium nitride layer. Whilst the aluminum nitride layers are of n-like conductivity, the gallium nitride layers are doped into p-type conductivity, with the consequent creation of pn junctions between the two kinds of buffer layers. Another pn junction is formed between one p-type gallium nitride layer and the adjoining n-like electron transit layer included in the main semiconductor region. The pn junctions serve for reduction of current leakage.

13 Claims, 6 Drawing Sheets

NITRIDE-BASED SEMICONDUCTOR DEVICE WITH REDUCED LEAKAGE CURRENT

CROSS REFERNCE TO RELATED APPLICATIONS

This is a continuation of Application PCT/JP2004/011058, filed Aug. 2, 2004, which claims priority to Japanese Patent Application No. 2003-289983 filed Aug. 8, 2003.

BACKGROUND OF THE INVENTION

This invention relates to semiconductor devices, particularly to those of the class employing nitrides or nitride-based compounds as semiconductors, as typified by metal semiconductor field-effect transistors (MESFETs) and high electron mobility transistors (HEMTs), and more particularly to such semiconductor devices of reduced leakage current. The invention also specifically pertains to a method of making such semiconductor devices.

The gallium-nitride-based semiconductor devices were known and used extensively which had the gallium-nitride-based semiconductor region formed on a sapphire substrate via a buffer region. The sapphire substrate had, however, a weakness of being difficult of dicing for its hardness, in addition to being expensive. These shortcomings of the sapphire substrate are absent from the substrate of silicon or silicon compound suggested by Japanese Unexamined Patent Publication No. 2003-59948. Being higher in heat conductivity than sapphire, the silicon or silicon-based substrate better liberates the heat that generates during operation of the semiconductor device, resulting in improvement in gain and other performance characteristics.

As taught also by the unexamined patent application above, a multilayered buffer region is interposed between the silicon or silicon-based substrate and the nitride semiconductor region constituting the primary working part of the semiconductor device. The buffer region is in the form of alternations of two different kinds of buffer layers such for instance as $Al_xGa_{1-x}N$, where the suffix x is a numeral grater than zero and equal to or less than one, and GaN.

The multilayered buffer region offers some definite advantages. First, being intermediate in lattice constant between the substrate and the gallium-nitride-based semiconductor region, the buffer region well conforms to the crystal orientation of the substrate. As the crystal orientation of the substrate is favorably conveyed to the buffer region, so it is to the semiconductor region. The result is improvement in the flatness of the semiconductor region, which in turn leads to better electrical characteristics of the semiconductor device.

Second, constituted of alternating $Al_xGa_{1-x}N$ and GaN as above, the buffer region is capable of crystal growth at higher temperatures than a buffer region consisting solely of either of these compounds. There is therefore little or no fear of the multilayered buffer region from becoming amorphous. The main semiconductor region, grown epitaxially on the multilayered buffer region, is to suffer less crystal defects, with a consequent reduction of leakage current.

However, when formed on a silicon or silicon compound substrate, which is low in electrical resistance, the multilayered buffer region has proved to possess its own drawbacks. Leakage current was easy to flow into the multilayered buffer region in a prior art device such as a HEMT in which the nitride-based semiconductor region was formed via the multilayered buffer region on the low resistance substrate. Even when no voltage was impressed to the gate of the HEMT, there was current leakage between drain and source, either via the multilayered buffer region or via the buffer region and low resistance substrate. The current leakage is of course a cause for power loss or a deterioration of performance characteristics. Further, in cases where the voltage-withstanding capability of the device is determined on the basis of the magnitude of leakage current, that capability was evaluated to be very low.

An obvious solution to the current leakage problem might seem to substitute aluminum nitride layers, which are more electrically insulating, for the $Al_xGa_{1-x}N$ layers of the multilayered buffer region, and to make the aluminum nitride layers thicker. Such aluminum nitride layers would give rise both to a lattice mismatch with the neighboring gallium nitride layers and to a difference in coefficient of thermal expansion, such that the aluminum nitride layers might be subjected to tensile stresses. The result would be the cracking of the multilayered buffer region or of the main semiconductor region formed thereon.

SUMMARY OF THE INVENTION

It is therefore an object of this invention to minimize current leakage in semiconductor devices of the kind having a main semiconductor region formed on a silicon or silicon compound substrate via a nitride semiconductor buffer region.

Stated briefly in one aspect thereof, the present invention provides a nitride-based semiconductor device such for example as a HEMT, MESFET or FET. Included is a substrate of silicon or silicon compounds such as silicon carbide or polycrystalline silicon. A main semiconductor region, which may be variously composed and configured depending upon the particular semiconductor device to be made, is formed on the silicon-containing substrate via a buffer region of a nitride-based semiconductor or semiconductors. A set of electrodes are connected to the main semiconductor region to complete the desired semiconductor device. The invention is best characterized by the fact that at least either of the buffer region and the main semiconductor region is adapted to provide a pn junction or junctions, either in the buffer region or between the buffer region and the main semiconductor region, for preventing current leakage therethrough.

Another aspect of the invention is such that a p-type impurity is introduced into at least part of the buffer region which, before introduction of the p-type impurity, has been either of a doped n-type nitride-based semiconductor or an undoped, substantially n-type (i.e., n-like) nitride-based semiconductor. Upon introduction of the p-type impurity, that at least part of the buffer region may either gain a p-type conductivity or become electrically resistive enough to prevent current leakage.

Constructed as outlined above, the semiconductor device according to the invention has a pn junction or junctions in the buffer region and/or between the buffer region and the main semiconductor region. The pn junction or junctions prevent current leakage from taking place through the buffer region or through both buffer region and substrate upon voltage application.

In preferred embodiments of the invention to be disclosed subsequently, the buffer region is comprised of alternations of first and second buffer layers of nitride-based semiconductors. The first buffer layers contain a prescribed proportion of aluminum whereas the second buffer layers contain aluminum in a proportion that is either zero or less than the aluminum proportion of the first buffer layers. One or more or all of the first buffer layers, or of the second buffer layers, may be doped with a p-type impurity for creation of a pn junction or junctions or for making the buffer region sufficiently resistive to prevent current leakage. The multilayered buffer region is preferred because it has a proven effectiveness for preventing the main semiconductor region from cracking and for improving the flatness of the main semiconductor region.

Experiment has proved that the dosage of the p-type impurity need not be so high as to convert the desired buffer layer or layers into p type. Even if no pn junction or junctions are created, the p-type impurity will counteract the preexisting n-type impurities and make the desired buffer layer or layers sufficiently resistive to the flow of leakage current.

Further, all of the first and the second buffer layers (i.e. complete buffer region) may be doped with a p-type impurity for creation of a pn junction between the buffer region and the main semiconductor region or for making the buffer region sufficiently resistive. An additional embodiment is disclosed in which indium is contained in at least either of the first and the second buffer layers in order to make the buffer region closer in thermal expansion coefficient to the silicon or silicon-based substrate. Boron is contained in another additional embodiment in at least either of the first and the second buffer layers in order to prevent the buffer region from cracking.

The present invention also concerns a method of making a nitride-based semiconductor device of the above summarized configuration. The method comprises growing a buffer region of a nitride-based semiconductor on a silicon or silicon-based substrate in a vapor phase, with a p-type impurity introduced into at least part of the buffer region. Then a main semiconductor region having at least one nitride-based semiconductor layer is grown on the buffer region in a vapor phase.

In short the buffer region is converted into p type, either in part or in whole, simply as the p-type impurity is admixed with the required gases for the fabrication of the buffer region. The desired semiconductor device of reduced current leakage is believed to be made most easily and inexpensively by this method.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

The nitride-based semiconductor device according to the invention will now be described more specifically in terms of the HEMT shown in FIG. 1. The exemplified HEMT broadly comprises:

1. A silicon substrate 1.
2. A multilayered buffer region 2 directly overlying the silicon substrate 1.
3. A main semiconductor region 3 grown epitaxially on the multilayered buffer region 2 and constituting the primary working part of the HEMT.
4. A source 4, shown also in FIG. 2, formed atop the main semiconductor region 3 so as to extend along a first edge thereof.
5. A drain 5 also formed atop the main semiconductor region 3 so as to extend along a second edge thereof which is opposite to the first.
6. A gate 6 formed between source 4 and drain 5 in parallel spaced relationship thereto.
7. A top cover 7 of electrically insulating material covering that part of the top surface of the main semiconductor region 3 which is left exposed by the electrodes 5-7.

The substrate 1 is of monocrystalline p-type silicon, doped with boron or like Group III element to gain the p-type conductivity. The major surface $1_a$ of the substrate 1, on which is formed the multilayered buffer region 3, is exactly (111) in terms of Miller indices. For reduction of current leakage the substrate 1 is made as low in impurity concentration as from $1 \times 10^{12}$ to $1 \times 10^{14}$ cm$^{-3}$, and as high in resistivity as from 100 to 10000 ohm-centimeters. The substrate 1 is approximately 500 micrometers thick, greater than the combined thickness of the multilayered buffer region 2 and main semiconductor region 3, in order to provide a mechanical support for these parts. The substrate 1 might be doped with an n-type impurity, instead of with the p-type one, or not doped at all.

The buffer region 2 is a lamination of alternating first buffer layers 8 and second buffer layers 9. Shown broken away in FIG. 1, the buffer region 2 typically has twenty first buffer layers 8 and as many second buffer layers 9. Speaking broadly, however, there may be provided from two to 200, preferably from 20 to 80, first buffer layers and as many second buffer layers.

The first layers 8 of the buffer region 2 are made from a nitride semiconductor containing at least aluminum in a prescribed proportion. Aside from impurities, the first buffer layers 8 are fabricated from any of the nitrides that are generally defined as:

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one. Preferred compounds meeting these requirements include aluminum nitride (AlN), aluminum gallium nitride (AlGaN), aluminum indium gallium nitride (AlInGaN), aluminum boron gallium nitride (AlBGaN), aluminum indium boron gallium nitride (AlInBGaN), aluminum indium nitride (AlInN), aluminum boron nitride (AlBN), and aluminum indium boron nitride (AlInBN).

Since the subscript y can be zero in the formula above, the first buffer layers 8 may not contain either indium or boron. In that case the nitrides employable for the first buffer layers 8 may be redefined as:

$$Al_xGa_{1-x}N$$

where the subscript x is as defined above. Gallium will also be absent from the composition of the first buffer layers 8 if x=1, leaving only aluminum nitride as a possible material therefor.

The first buffer layers 8 are of an n-type semiconductor or, alternatively, an n-like semiconductor, behaving as if it were of n-type despite absence of an n-type impurity. It is also fairly electrically insulating. In terms of lattice constant and thermal expansion coefficient the first buffer layers 8 are closer to the silicon substrate 1 than are the second buffer layers 9. The lattice constant of the first buffer layers 8 should be less than that of the second buffer layers 9. Optionally, for reduction of current leakage, a pn junction might be created between buffer region 2 and main semiconductor region 3, with a p-type impurity introduced into the first buffer layers 8.

The first buffer layers 8 should each be from about 0.5 to about 50 nanometers thick. If they were less than about 0.5 nanometer thick, the main semiconductor region 3 might not be formed on the buffer region 2 to a desired degree of flatness. Should they be more than about 50 nanometers thick, on the other hand, the first buffer layers 8 might crack from a lattice mismatch with the second buffer layers 9 and from the tensile straining of the first buffer layers due to a difference in thermal expansion coefficient between the substrate 1 and the first buffer layers 8.

The second buffer layers 9 are of a p-type nitride semiconductor that does not contain aluminum or that does contain aluminum in a less proportion than does the first buffer layers 8. Aside from impurities, the compositions of the second buffer layers 9 are generally expressed by the formula:

$$Al_aM_bGa_{1-a-b}N$$

where M is at least either of indium and boron; the subscript a is a numeral that is equal to or greater than zero, less than one, and less than x in the formula above generally defining the compositions of the first buffer layers 8; the subscript b is a numeral that is equal to or greater than zero and less than one; and the sum of a and b is equal to or less than one.

Preferred compounds meeting the foregoing requirements for the second buffer layers 9 include gallium nitride (GaN), aluminum gallium nitride (AlGaN), aluminum indium gallium nitride (AlInGaN), aluminum boron gallium nitride (AlBGaN), aluminum indium boron gallium nitride (AlInBGaN), aluminum indium nitride (AlInN), aluminum boron nitride (AlBN), aluminum indium boron nitride (AlInBN), indium gallium nitride (InGaN), boron gallium nitride (BGaN), indium boron gallium nitride (InBGaN), indium nitride (InN), boron nitride (BN), and indium boron nitride (InBN).

A p-type impurity is introduced into the second buffer layers 9 in this particular embodiment. The p-type conductivity is needed for creation of pn junctions between the two kinds of buffer layers 8 and 9 as well as between the second buffer layers 9 and an n-like electron transit layer 11, yet to be set forth, which is included in the main semiconductor region 3.

Since the subscript b can be zero in the formula above defining the possible compositions of the second buffer layers 9, these layers may contain neither boron or indium. The compositions of the second buffer layers 9 may then be redefined as:

$$Al_yGa_{1-y}N$$

where the subscript y is a numeral that is equal to or greater than zero, less than one, and less than x in the formula above generally defining the compositions of the first buffer layers 8. If y is also zero, then only GaN is left for the second buffer layers 9.

Preferably, the subscript y indicating an aluminum proportion in the second buffer layers 9 should be less than about 0.8 in order to preclude the danger of the cracking of these layers. It is also recommended that the aluminum proportion of the second buffer layers 9 be less than that of the first buffer layers 8.

The second buffer layers 9 should each be from about 0.5 to about 200 nanometers thick. If they were less than about 0.5 nanometer thick, the first buffer layers 8 might not be formed thereon to a desired degree of flatness, nor might the main semiconductor region 3 be on the resulting buffer region 2. Should they be more than about 200 nanometers thick, on the other hand, then cracking might again occur from a drop in the stress mitigation effect of the alternating first and second buffer layers 8 and 9.

Preferably, the second buffer layers 9 should each be thicker than each first buffer layer 8. The straining of the first buffer layers 8 due to a lattice mismatch with the second buffer layers 9 and to a different thermal expansion coefficient from that of the substrate 1 will then be reduced to such an extent that the first buffer layers will not crack. The electron transit layer 11 will also be higher in electron density.

Figure 1:
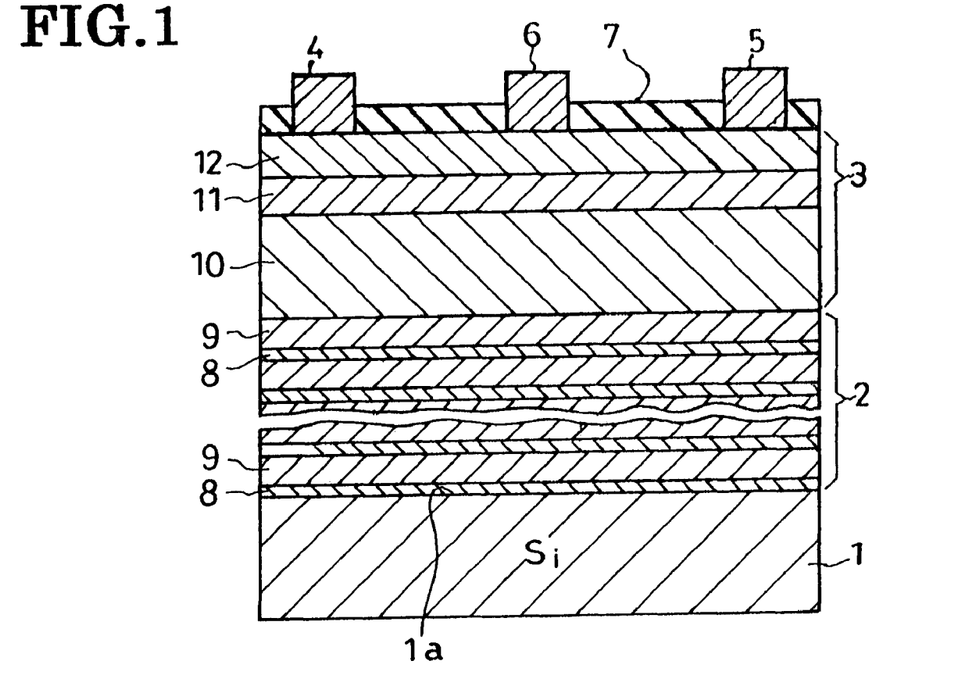
FIG. 1 is a schematic sectional illustration, partly broken away for illustrative convenience, of a HEMT embodying the principles of the invention.

With continued reference to FIG. 1, for provision a HEMT, itself well known in the art, the main semiconductor region 3 is shown as a lamination of the noted electron transit layer 10 of undoped GaN, a spacer layer 11 of undoped $Al_{0.2}Ga_{0.8}N$, and an electron supply layer 12 of n-type $Al_{0.2}Ga_{0.8}N$ doped with an n-type impurity of silicon. Generally, these constituent layers 10-12 of the main semiconductor region 3 may all be of gallium-based nitride semiconductors.

Directly overlying the buffer region 2, the electron transit layer 10 (sometimes referred to as channel layer) of the main semiconductor region 3 is approximately 500 nanometers thick. Although made from undoped GaN, this layer 10 functions as n-like semiconductor layer. The n-like electron transit layer adjoins the topmost p-type second layer 9 of the buffer region 2, creating a pn junction for reduction of current leakage.

The spacer layer 11 overlying the electron transit layer 10 is approximately seven nanometers thick. The primary function of this layer 11 is to prevent the n-type impurity of silicon from diffusing from the electron supply layer 12 into the electron transit layer 10. The provision of the spacer layer 11 is not an absolute requirement.

The topmost n-type electron supply layer 12 is approximately 30 nanometers thick. It functions to supply to the electron transit layer 10 the electrons generated by the donor (n-type) impurity.

Figure 2:
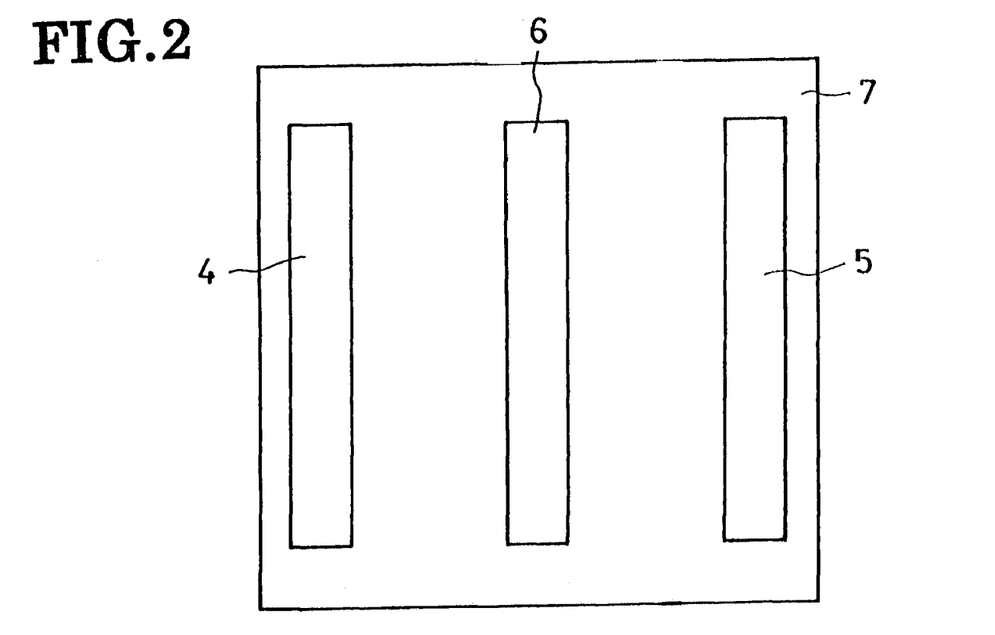
FIG. 2 is a top plan of the HEMT of FIG. 1.

As depicted in both FIGS. 1 and 2, the source 4 and drain 5 make ohmic contact with the electron supply layer 12 of the main semiconductor region 3 whereas the gate 6 makes Schottkey contact therewith. The source 4 and drain 5 could both be held against the electron supply layer 12 via a contact layer of high n-type impurity concentration. The top cover 7, which may be of silicon dioxide, covers the surface part of the main semiconductor region 3 which is left exposed by the three electrodes 4-6. Optionally, another electron supply layer may be provided between buffer region 2 and main semiconductor region 3.

Both spacer layer 11 and electron supply layer 12 of the main semiconductor region 3 are so thin compared to the size of their major surfaces that they function as insulators in their transverse directions and as conductors in their thickness direction. Consequently, upon application of a higher voltage to the drain 5 than to the source 4, and of a conduction-causing control voltage (e.g. zero volt) to the gate 6, an electron current will flow along the path sequentially comprising the source 4, electron supply layer 12, spacer layer 11, electron transit layer 10, spacer layer 11, electron supply layer 12, and drain 5. This flow of electrons is adjustable by the control voltage impressed to the gate 6. Leakage current will flow between source 4 and drain 5 during the nonconducting periods of the HEMT when no conduction-causing control voltage is impressed to the gate 6. The present invention reduces this leakage current.

Method of Fabrication

Described hereinbelow is a method of making the HEMT of the FIG. 1 configuration, in which the first layers 8 of the buffer region 2 are of AlN, and the second layers 9 thereof are of GaN with a p-type dopant.

Figure 3A:
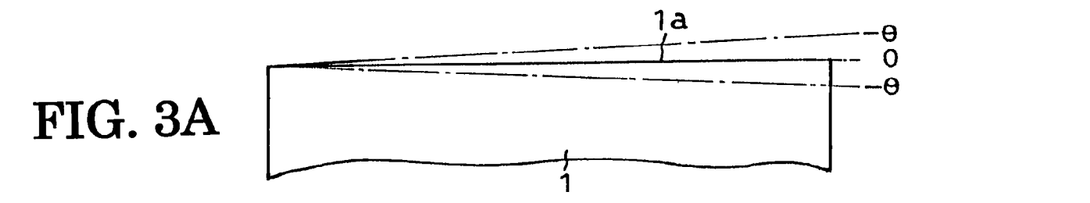
FIG. 3A is a fragmentary side view of a substrate used for fabricating the HEMT of FIG. 1.

There was first prepared the silicon substrate 1 doped with a p-type impurity, as shown fragmentarily in FIG. 3A. The major surface $1_a$ of this silicon substrate, on which there was to be grown the multilayered buffer region 2, was exactly (111) in terms of Miller indices of crystal orientation. Broadly speaking, however, departures from this plane in either direction are permissible within an angle of plus or minus $\theta$ degrees, as indicated in FIG. 3A. The permissible angle of departures $\theta$ is plus or minus four degrees, preferably plus or minus three degrees, and most desirably plus or minus two degrees. The (111) crystal orientation, or minimal departures therefrom, of the major surface $1_a$ of the silicon substrate 1 is conducive to the appearance of little or no atomic-level steps during the epitaxial growth of the multilayered buffer region 2 and main semiconductor region 3 thereon.

Then the multilayered buffer region 2 was created on the major surface $1_a$ of the silicon substrate 1 by alternately laminating the first buffer layers 8 of AlN and second buffer layers 9 of p-type GaN. The particular method employed here was the known metal organic chemical vapor deposition (MOCVD), a type of epitaxial growth.

Figure 3B:
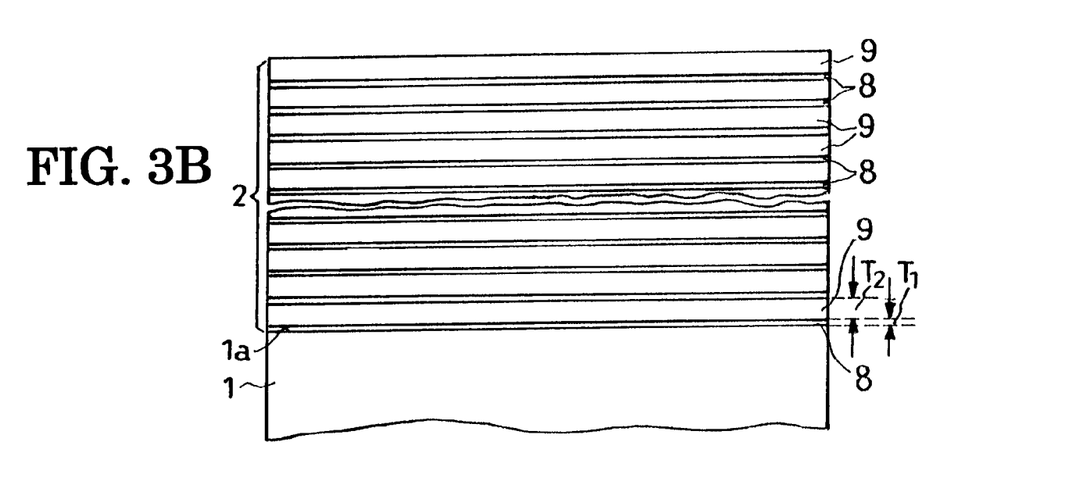
FIG. 3B is a fragmentary side view showing the multilayered buffer region formed on the substrate of FIG. 3A.

More specifically, the p-type monocrystalline silicon substrate, which has been pretreated with a hydrofluoride-based etchant, was introduced into an MOCVD reactor and had oxide films stripped off its surfaces by thermal annealing at 1120° C. for about 10 minutes. Then, as indicated in FIG. 3B, one first buffer layer 8 was formed on the major surface $1_a$ of the substrate 1 to a thickness $T_1$ of about 10 nanometers by charging both trimethylaluminum (TMA) and ammonia ($NH_3$) gases into the reactor for approximately 65 seconds. The TMA gas (i.e. aluminum) was introduced at about 63 micromoles per minute, and the $NH_3$ gas (i.e. $NH_3$) at about 0.14 moles per minute.

Then, after terminating the supply of TMA gas, all of trimethyl gallium (TMG) gas, bis-cyclo pentadienyl magnesium ($Cp_2Mg$) gas, and $NH_3$ gas were introduced into the reactor for about 90 seconds. There was thus created on the preformed first buffer layer 8 one second buffer layer 9 of p-type GaN to a thickness $T_2$ of about 30 nanometers. The TMG gas (i.e. gallium) was introduced at about 60 micromoles per minute, the $Cp_2Mg$ gas (i.e. magnesium) at about 0.1 micromole per minute, and the $NH_3$ gas (i.e. $NH_3$) at about 0.14 mole per minute.

Thereafter the fabrication of another first buffer layer 8 of AlN on the preformed second buffer layer 9, and of another second buffer layer 9 of p-type GaN on the preformed first buffer layer 8 was repeated nineteen times as in FIG. 3B. There was thus completed the multilayered buffer region 2 consisting of twenty alternations of first buffer layers 8 and second buffer layers 9. As has been mentioned, a different number, say 50, of first buffer layers 8 and of second buffer layers 9 could have been made within the scope of the invention. Magnesium employed as a p-type impurity is by way of example only; instead, there could be used any such Group II elements as zinc, strontium, calcium, beryllium, barium, cadmium, and radium.

The MOCVD method was also adopted for creation of the main semiconductor region 3, FIG. 1, on the multilayered buffer region 2. With the article of FIG. 3B, the substrate 1 with the multilayered buffer region 2 thereon, held placed in the MOCVD reactor, both trimethylgallium (TMG) gas and $NH_3$ gas were fed into the reactor for about 10 minutes. There was thus formed an electron transit layer 10 of undoped GaN to a thickness of about 500 nanometers on the surface of the multilayered buffer region 2. This electron transit layer 10 was an n-like semiconductor layer. The TMG gas (i.e. gallium) was charged at about 70 micromoles per minute, and the $NH_3$ gas (i.e. $NH_3$) at about 0.11 mole per minute.

Then TMA, TMG and $NH_3$ gases were introduced into the reactor for 32 seconds. A spacer layer 11 of undoped $Al_{0.2}Ga_{0.8}N$ was thus formed to a thickness of seven nanometers on the surface of the electron transit layer 10. The TMA gas (i.e. aluminum) was introduced at about 5.8 micromoles per minute, the TMG gas at about 17 micromoles per minute, and the $NH_3$ gas at about 0.11 mole per minute.

Then, after a 15-minute pause, all of TMA, TMG, $NH_3$ and silane ($SiH_4$) gases were introduced into the reactor for about 138 seconds. An electron supply layer 12 of $Al_{0.2}Ga_{0.8}N$, complete with an n-type impurity, was thus formed on the surface of the spacer layer 11 to a thickness of about 30 nanometers. The TMA gas was introduced at about 5.8 micromoles per minute, the TMG gas at about 17 micromoles per minute, the $NH_3$ gas at about 0.11 mole per minute, and the $SiH_4$ gas at about 21 nanomoles per minute.

Then the silicon substrate 1 with the multilayered buffer region 2 and main semiconductor region 3 grown thereon was withdrawn from the reactor. Then the insulating covering 7 of silicon oxide was formed on the entire exposed surfaces of the main semiconductor region 3 by the familiar method of plasma chemical vapor deposition. The insulating covering 7 was about 250 nanometers thick.

Although only one HEMT is shown in the drawings, actually a number of such devices were fabricated concurrently using a large enough semiconductor wafer, of which the illustrated substrate 1 is part. The finished semiconductor wafer was then put to photolithographic dicing, such that the boundaries between the HEMTs were etched down to the silicon substrate 1 by reactive ion etching with chlorine ($Cl_2$) and chlorine-based gas. Such incomplete dicing, with the silicon substrate 1 left intact, is preferred for ease of the investigation of each individual device without being affected by the others.

Then, for creation of source 4 and drain 5, windows for these electrodes were opened in the insulating covering 7 using both photolithography and a hydrofluoric-acid-based etchant. Then titanium and aluminum layers were laminated on the exposed surface parts of the main semiconductor region 3 by electron beam deposition through the windows. A liftoff was then made to complete the source 4 and drain 5. Then, for creation of a gate 6, a window was similarly opened in the insulating covering 7, and palladium, titanium and gold were electron-beam deposited through the window on the exposed surface. A liftoff was then made to form the gate 6 capable of functioning as Schottky-barrier electrode. Thereafter the wafer was completely diced into the individual HEMT chips.

The first preferred embodiment of the invention, configured as drawn in FIGS. 1 and 2 and fabricated as set forth with reference to FIGS. 3A and 3B, offers some distinct advantages. First, as a result of introduction of a p-type impurity of magnesium into the second layers 9 of the buffer region 2, pn junctions are created between n-like first buffer layers 8 and p-type second buffer layers 9. An additional pn junction is created between the topmost second buffer layer 9 and the n-like electron transit layer 10 of the main semiconductor region 3. A reduction is thus accomplished of the leakage current $I_d$, FIG. 4, which flows between source 4 and drain 5 upon application of a voltage therebetween during the nonconducting periods of the HEMT. More specifically, if the drain 5 has a positive potential, and the source 4 a negative potential, the noted pn junctions will minimize the leakage current flowing along the path sequentially comprising the drain 5, electron supply layer 12, spacer layer 11, electron transit layer 10, buffer region 2 (or buffer region plus the substrate 1), electron transit layer 10, spacer layer 11, electron supply layer 12, and source 4.

Figure 4:
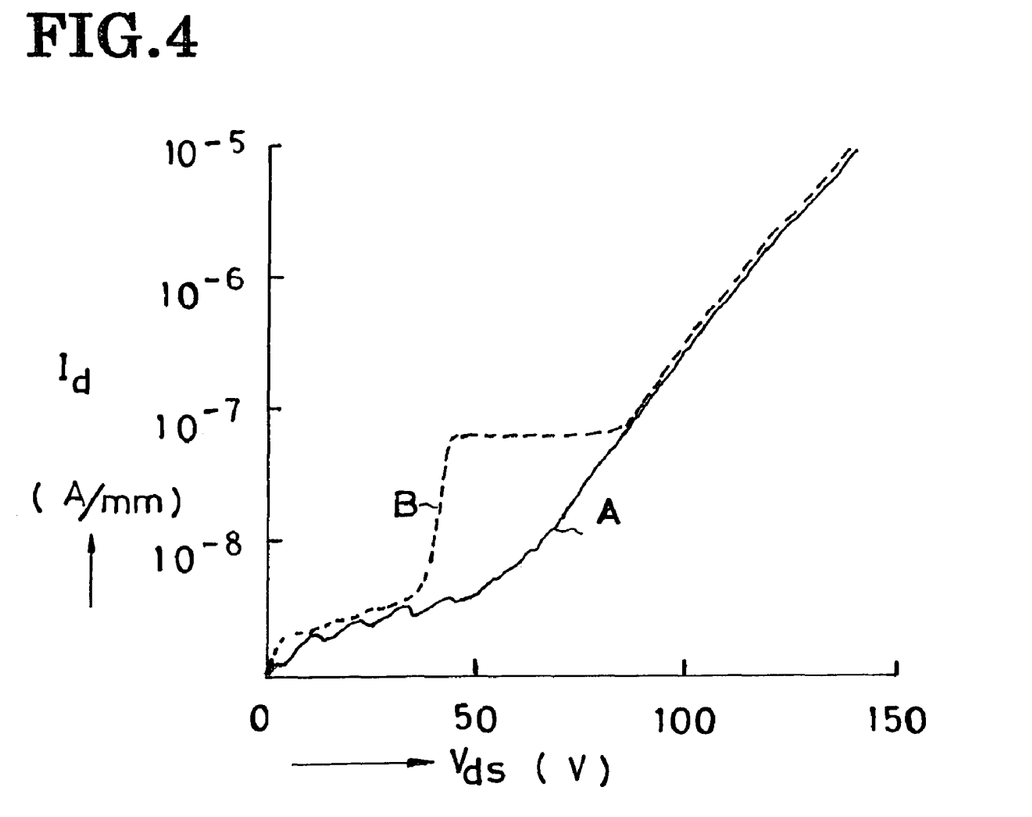
FIG. 4 is a graph plotting the curves of the leakage current against the drain-source voltage as exhibited by the HEMT according to the invention and its closest conventional counterpart.

The graph of FIG. 4 plots the curves of the leakage current $I_d$ against the drain-source voltage $V_{ds}$ when the HEMT is nonconducting. The solid-like curve A represents the FIG. 1 embodiment of the present invention, and the broken-like curve B a prior art HEMT of essentially the same construction except that no p-type impurity has been added to the buffer region 2. Attention may be paid to the abrupt rise of the leakage current $I_d$ at about 40 volts according to the prior art curve B. The curve A according to the invention has no such rise. The usual practice in the semiconductor industry is to evaluate the voltage-withstanding capabilities of semiconductor devices in terms of the magnitude of leakage current. The inventive HEMT of the curve A will therefore be judged a high voltage device, and the prior art one of the curve B a low voltage device.

Another advantages accrues from the first buffer layers 8 of aluminum nitride which is intermediate in lattice constant between silicon and gallium nitride. Containing these aluminum nitride layers 8, the buffer region 2 faithfully conforms to the crystal orientation of the silicon substrate 1. As a result, this buffer region 2 can be overlaid with the main semiconductor region 3 of nitride semiconductors, containing gallium at least, in proper crystal orientation. Further, as the main semiconductor region 3 improves in flatness, the resulting HEMT gains better electrical characteristics. Contrary to the teachings of the instant invention, should the buffer region be fabricated solely from a gallium nitride semiconductor at low temperatures, the main semiconductor region would not be formed thereon with a desired degree of flatness by reason of the difference in lattice constant between silicon and gallium nitride.

A further advantage is that, constituted of alternating aluminum nitride and gallium nitride layers 8 and 9, the buffer region 2 is capable of growth at higher temperatures than the prior art monolayered buffer region of either gallium nitride or aluminum nitride only. The higher temperature growth of the buffer region leads to a more complete decomposition of ammonia employed as a nitrogen source, saving the buffer region 2 from becoming amorphous. Still further, grown epitaxially on this buffer region 2, the main semiconductor region 3 will be sufficiently low in the density of crystal defects to prevent current leakage. All in all, the HEMT will be obtained which has a very good pinch-off characteristic.

Figure 5:
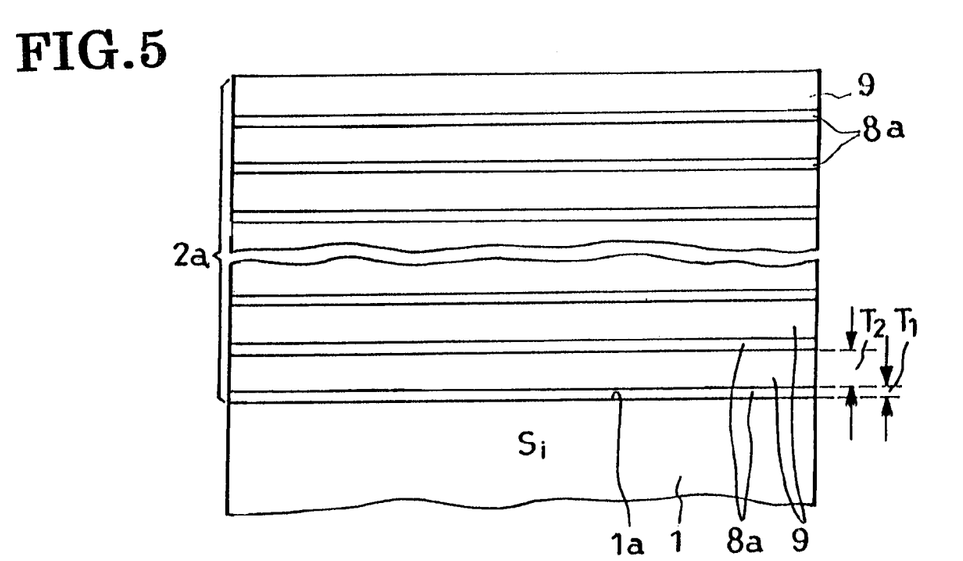
FIG. 5 is a fragmentary side view of a buffer region representing another preferred embodiment of the invention.

Embodiment of FIG. 5

The multilayered buffer region 2 of the FIG. 1 embodiment is modifiable as indicated in FIG. 5. Generally designated $2_a$, the modified multilayered buffer region differs from its FIG. 1 counterpart 2 in that a p-type impurity (e.g. magnesium) is introduced into the first buffer layers $8_a$. The second buffer layers 9 are of p-type like that of FIG. 1, being doped with a p-type impurity. Thus the modified buffer region $2_a$ comprises a required number of alternations of p-type first layers $8_a$ and p-type second layers 9. The compositions of these buffer layers $8_a$ and 9, aside from the p-type impurity, are the same as those of the buffer layers 8 and 9 of the FIG. 1 embodiment. The HEMT incorporating the modified buffer region $2_a$ is identical with that of FIG. 1 in all the other details of construction.

Although the entire buffer region $2_a$ is of p-type in this alternate embodiment, the pn junction remains between this p-type buffer region and the n-like electron transit layer 10, FIG. 1, of the main semiconductor region 3. This remaining pn junction reduces current leakage substantially as in FIG. 1. As a modification of this FIG. 5 embodiment, the silicon substrate 1 could be doped with an n-type impurity to obtain another pn junction between the substrate and the p-type buffer region $2_a$.

Figure 6:
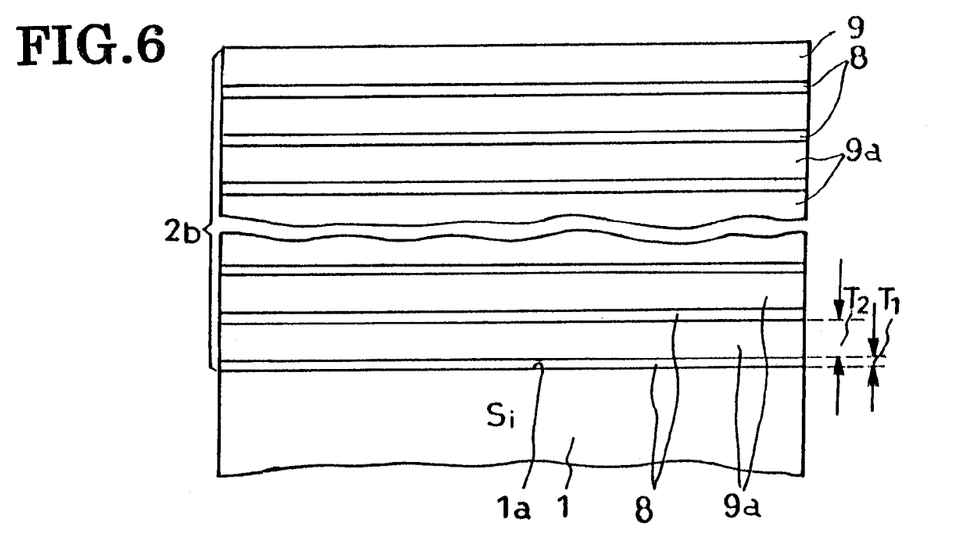
FIG. 6 is a view similar to FIG. 6 but showing a buffer region representing still another preferred embodiment of the invention.

Embodiment of FIG. 6

In another modified buffer region $2_b$ shown in FIG. 6, no p-type impurity is added to a plurality (e.g. eighteen) of second layers $9_a$ from the bottommost one (i.e. the one adjoining the silicon substrate 1) upward. The overlying one or more, two in this embodiment, second buffer layers 9 do contain a p-type impurity. All the first buffer layers 8 do not contain a p-type impurity as in the FIG. 1 buffer region 2. The layers 8 and 9 of this modified buffer region $2_b$ is of the same compositions as their FIG. 1 counterparts, and the modified second layers $9_a$ differ in composition from the unmodified second layers 9 only in the absence of the p-type impurity. The HEMT incorporating the modified buffer region $2_b$ is also identical with that of FIG. 1 in all the other details of construction.

This FIG. 6 embodiment is akin to that of FIG. 5 in that a pn junction is created between the buffer region $2_b$ and the overlying n-like electron transit layer 10 of the main semiconductor region 3. Additionally, in this embodiment, pn junctions exist between the n-like first layers 8 and p-type second layers 9 of the buffer region $2_b$. All these pn junctions contribute to the reduction of current leakage. As a modification of this FIG. 6 embodiment, those first buffer layers 8 which adjoin the p-type second layers 9 may be doped with a p-type impurity. Even then the pn junction between buffer region $2_b$ and n-like electron transit layer 20 will be effective for current leakage reduction.

Figure 7:
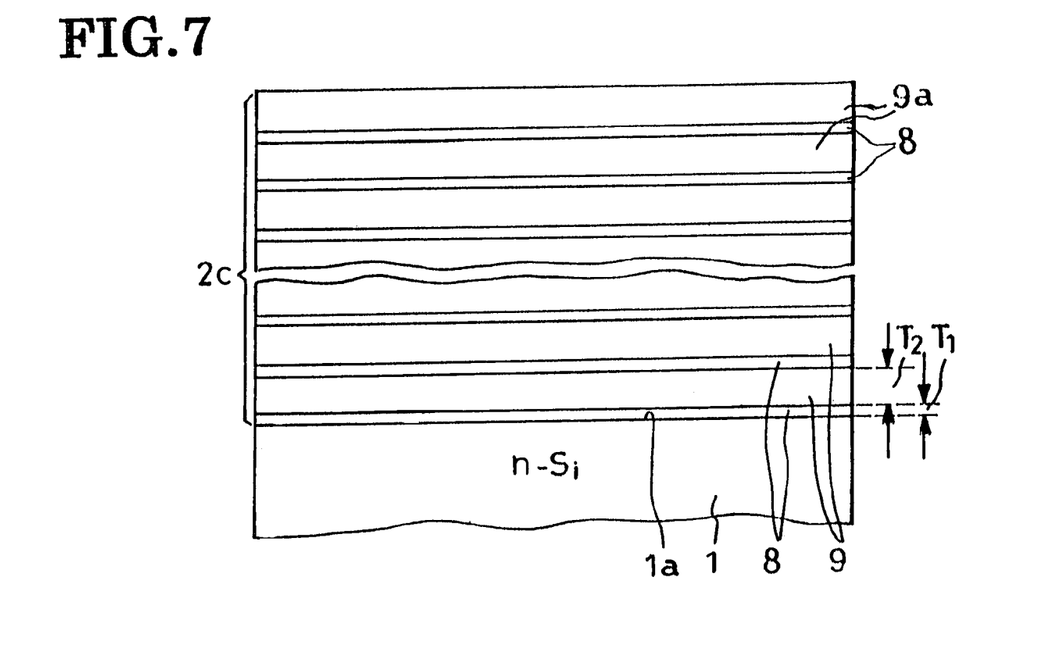
FIG. 7 is also a view similar to FIG. 6 but showing a buffer region representing yet another preferred embodiment of the invention.

Embodiment of FIG. 7

Still another modified buffer region $2_c$ of FIG. 7 differs from its FIG. 6 counterpart $2_b$ only in that a desired number of lower second layers 9 are doped with a p-type impurity whereas the overlying rest of second layers $9_a$ are not. The main compositions of the buffer layers 8, 9 and $9_a$ are as set forth above with reference to FIG. 6. The HEMT incorporating the modified buffer region $2_c$ is also identical with that of FIG. 1 in all the other details of construction except that the silicon substrate 1 is doped into n-type.

The arrangement of the undoped second buffer layers $9_a$ at the upper part of the buffer region $2_c$ offers the advantage that the main semiconductor region can be grown thereon without interference with the p-type dopant. Generally, a buffer region deteriorates in crystallinity when doped with a p-type impurity. By being not doped, the upper part of the buffer region $2_c$ has better crystallinity than its lower part, permitting the main semiconductor region 3 to grow thereon with correspondingly better crystallinity.

Desired pn junctions for current leakage reduction are nevertheless created in this embodiment between the lower second buffer layers 9 and the adjoining first buffer layers 8. Another pn junction exists between n-type silicon substrate 1 and buffer region $2_c$.

Figure 8:
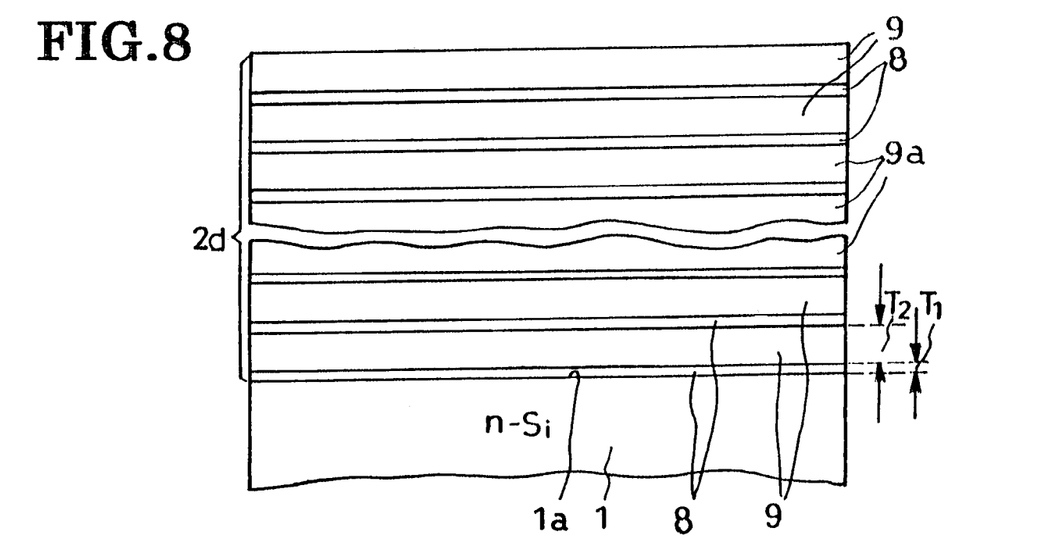
FIG. 8 is also a view similar to FIG. 6 but showing a buffer region representing a further preferred embodiment of the invention.

Embodiment of FIG. 8

FIG. 8 shows a further modified buffer region $2_d$ in which the second layers 9 that are doped with a p-type impurity are disposed both upwardly and downwardly of some intermediate second layers $9_a$ that are not so doped. The main compositions of the buffer layers 8, 9 and $9_a$ are as set forth above with reference to FIG. 6. The HEMT incorporating the modified buffer region $2_d$ is also identical with that of FIG. 1 in all the other details of construction except that the silicon substrate 1 is doped into n-type.

Desired pn junctions for current leakage reduction are created in this embodiment between the two divided groups of p-type second buffer layers 9 and the adjoining first buffer layers 8. Another pn junction exists between the n-type silicon substrate 1 and the lower group of p-type second buffer layers 9.

Figure 9:
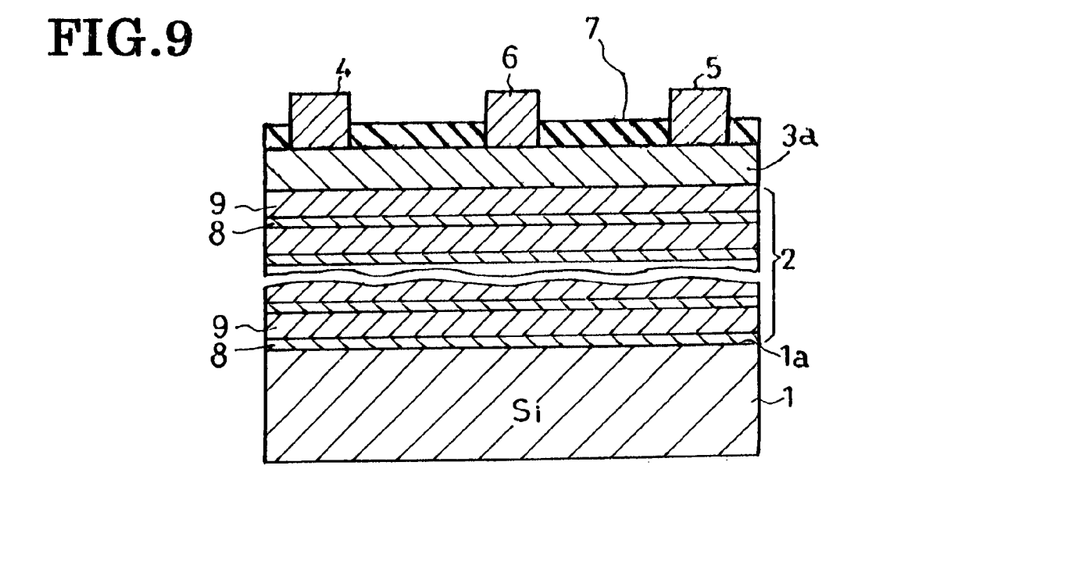
FIG. 9 is a view similar to FIG. 1 but showing a MESFET representing another possible application of the invention.

Embodiment of FIG. 9

FIG. 9 is an illustration of a MESFET embodying the principles of this invention. The MESFET is analogous in construction with the HEMT of FIG. 1 except that the triple-layered main semiconductor region 3 of the latter is replaced by a monolayered n-type main semiconductor region $3_a$ of silicon-doped gallium nitride. All the other parts or components of the MESFET are therefore identified by the same reference characters as used in FIG. 1 to denote the corresponding parts or components of the HEMT.

The n-type main semiconductor region $3_a$, known also as the channel or active layer, directly overlies the multilayered buffer region 2 incorporating the features of this invention. The source 4 and drain 4 make ohmic contact with the main semiconductor region $3_a$ whereas the gate 6 makes Schottky barrier contact therewith.

All the parts of the MESFET other than the main semiconductor region $3_a$ are capable of fabrication by the same method as are the corresponding parts of the FIG. 1 HEMT.

The main semiconductor region $3_a$ of silicon-doped gallium nitride may be grown in the same reactor as used to form the multilayered buffer region 2 on the silicon substrate 1. Upon completion of the buffer region 2 there may be introduced into the reactor a mixture of TMG, $NH_3$ and $SiH_4$ gases for about five minutes, thereby causing the n-type main semiconductor region $3_a$ to grow on the buffer region to a thickness of about 250 nanometers. More specifically, the TMG gas may be charged at about 70 micromoles per minute, the $NH_3$ gas at 0.11 mole per minute, and the $SiH_4$ gas (i.e. silicon) at 21 nanomoles per minute.

Configured and fabricated as in the foregoing according to the teachings of the invention, the MESFET will gain the same advantages as does the HEMT of FIG. 1. The advantages include reduction of current leakage through the buffer region 2, improved flatness and crystallinity of the main semiconductor region $3_a$, and better performance characteristics of the resulting device.

Figure 10:
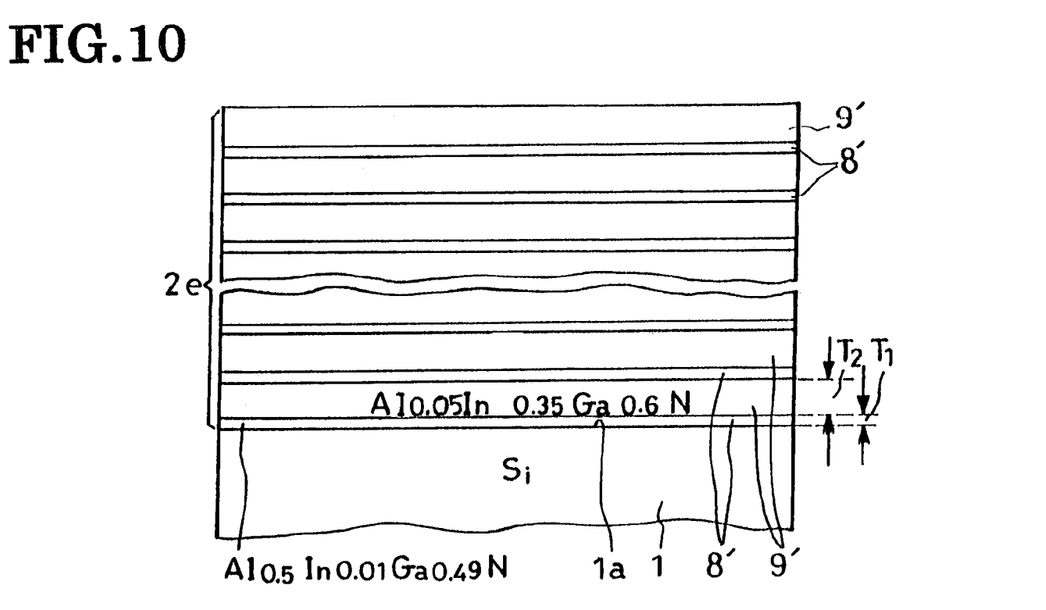
FIG. 10 is a view similar to FIG. 6 but showing a buffer region representing a further preferred embodiment of the invention.

Embodiment of FIG. 10

The multilayered buffer region $2_e$ of FIG. 10 differs from the buffer regions of all the preceding embodiments in that indium is contained in either or both of its first layers 8' and second layers 9'. The indium-containing buffer region $2_e$ is adaptable for use in both HEMTs and MESFETs.

The composition of the first layers 8' of the buffer region $2_e$ is generally defined as:

where the subscript x is a numeral that is greater than zero and equal to or less than one; the subscript y is a numeral that is equal to or greater than zero and less than one; and the sum of x and y is equal to or less than one. The compounds meeting these requirements of the first buffer layers 8' include aluminum indium nitride (AlInN), aluminum gallium indium nitride (AlGaInN), aluminum nitride (AlN), and aluminum gallium nitride (AlGaN). The particular composition of the first buffer layers 8' in this FIG. 10 embodiment is $Al_{0.5}In_{0.01}Ga_{0.49}N$ (x=0.5, y=0.01). Undoped, the first buffer layers 8' are of an n-like semiconductor. The aluminum-containing first buffer layers 8' are intermediate in both lattice constant and thermal expansion coefficient between the silicon substrate 1 and the main semiconductor region 3 or $3_a$.

The second layers 9' of the buffer region $2_e$ are of a nitride semiconductor doped with a p-type impurity. The composition of the second buffer layers 9' are generally expressed by the formula:

where the subscript a is a numeral that is equal to or greater than zero, less than one, and less than x in the formula above defining the composition of the first buffer layers 8'; the subscript b is a numeral that is equal to or greater than zero and les than one; and the sum of a and b is equal to or less than one. The compounds meeting this definition of the second buffer layers 9' include aluminum indium gallium nitride (AlInGaN), indium gallium nitride (InGaN), indium nitride (InN), aluminum indium nitride (AlInN), gallium nitride (GaN), and aluminum gallium nitride (AlGaN). The particular composition of the second buffer layers 9' in this FIG. 10 embodiment is $Al_{0.05}In_{0.35}Ga_{0.6}N$ (a=0.05, b=0.35). The second buffer layers 9' of this composition is less than the first buffer layers 8' in bandgap (gap between valance band and conduction band).

What follows is a method of fabricating the multilayered buffer region $2_e$, given on the assumption that the n-like first layers 8' are of $Al_{0.5}In_{0.01}Ga_{0.49}N$, and the p-type second layers 9' of $Al_{0.05}In_{0.35}Ga_{0.6}N$. A monocrystalline silicon substrate was placed in an MOCVD reactor and stripped of surface oxide films by thermal annealing. Then a mixture of TMA, TMG, trimethyl indium (TMIn), and $NH_3$ gases was introduced into the reactor for about 24 seconds, thereby forming one first buffer layer 8' of the desired composition on the substrate to a thickness $T_1$ of about five nanometers.

Then, after terminating the supply of the TMA, TMG and TMIn gases into the reactor, the substrate was allowed therein to cool to 750° C. Then a mixture of TMA, TMQ TMIn, $CP_2Mg$, and $NH_3$ gases was charged into the reactor for about 83 seconds. There was thus created on the first buffer layer 8' one second buffer layer 9' of the desired $Al_{0.05}In_{0.35}Ga_{0.6}N$ composition to a thickness $T_2$ of 30 nanometers.

Thereafter the fabrication of another first buffer layer 8' of $Al_{0.5}In_{0.01}Ga_{0.49}N$ on the preformed second buffer layer 9', and of another magnesium-containing second buffer layer 9' of $Al_{0.05}In_{0.35}Ga_{0.6}N$ on the preformed first buffer layer 8', was repeated nine times. There was thus completed the multilayered buffer region $2_e$ consisting of ten alternations of first buffer layers 8' and second buffer layers 9' in this particular embodiment.

It will be appreciated that the semiconductor device with the modified buffer region $2_e$ of FIG. 10 contains pn junctions between the n-like first buffer layers 8' and p-type second buffer layers 9', gaining the same advantages as does the FIG. 1 embodiment. An additional advantage is that, containing indium, the buffer region $2_e$ is closer in thermal expansion coefficient to the silicon substrate 1 than in the absence of indium. It is unnecessary, however, that both first and second layers 8' and 9' of the buffer region contain indium; instead, only either of them may contain indium to achieve essentially the same goal.

Figure 11:
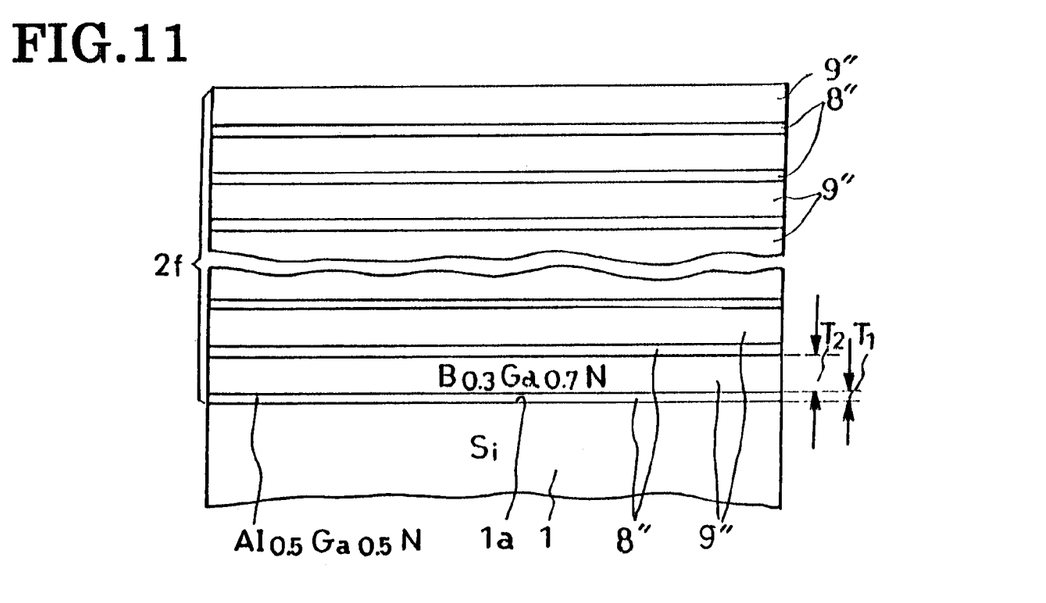
FIG. 11 is also a view similar to FIG. 6 but showing a buffer region representing a still further preferred embodiment of the invention.

Embodiment of FIG. 11

In FIG. 11 is shown a further modified multilayered buffer region $2_f$ which is adaptable for use in both HEMTs and MESFETs. Made up of alternations of n-like first layers 8" and p-type second layers 9", the buffer region $2_f$ differs from the foregoing embodiments in that boron is contained in at least either of these layers 8" and 9".

The composition of the first layers 8" of the buffer region $2_f$ is generally defined as:

$$Al_xB_yGa_{1-x-y}N$$

where the subscript x is a numeral that is greater than zero and equal to or less than one; the subscript y is a numeral that is equal to or grater than zero and less than one; and the sum of x and y is equal to or less than one. This general formula encompasses nitrides such as AlN, AlGaN, AlBN, and AlBGaN. The particular composition of the first buffer layers 8" in this FIG. 11 embodiment is $Al_{0.5}Ga_{0.5}N$ (x=0.5, y=0). The first buffer layers 8" are closer in both lattice constant and thermal expansion coefficient to the silicon substrate 1 than are the second buffer layers 9".

The second layers 9" of the buffer region $2_f$ have compositions that are generally expressed by the formula:

$$Al_aB_bGa_{1-a-b}N$$

where the subscripts a and b are both numerals that are equal to or greater than zero and less than one; the sum of a and b is equal to or less than one; and the subscript a is less than the subscript x in the formula above defining the composition of the first buffer layers 8". The compounds meeting this definition of the second buffer layers 9" include AlBGaN, BN, GaN, AlGaN, AlBN, and BGaN. The particular composition of the second buffer layers 9" in this FIG. 11 embodiment is $B_{0.3}Ga_{0.7}N$ (a=0, b=0.3). The second buffer layers 9" of this composition is less in bandgap than the first buffer layers 8".

The following method was adopted for fabricating the buffer region $2_f$ comprised of the n-like first layers 8" of $Al_{0.5}Ga_{0.5}N$ and the p-type second layers 9" of $B_{0.3}Ga_{0.7}N$ doped with a p-type impurity. A monocrystalline silicon substrate was placed in an MOCVD reactor and stripped of surface oxide films by thermal annealing. Then a mixture of TMA, TMG, and $NH_3$ gases was introduced into the reactor for about 27 seconds, thereby forming one first buffer layer 8" of the desired composition on the substrate to a thickness $T_1$ of about five nanometers.

Then, after terminating the supply of the TMA gas into the reactor, the substrate was allowed therein to cool to 1120° C. Then a mixture of triethyl boron (TEB), TMQ $CP_2Mg$, and $NH_3$ gases was charged into the reactor for about 85 seconds. There was thus created on the first buffer layer 8" one second buffer layer 9" of the desired n-type $B_{0.3}Ga_{0.7}N$ composition to a thickness $T_2$ of 30 nanometers.

Thereafter the fabrication of another first buffer layer 8" of $Al_{0.5}Ga_{0.5}N$ on the preformed second buffer layer 9", and of another second buffer layer 9" of $B_{0.3}Ga_{0.7}N$ on the preformed first buffer layer 8", was repeated forty-nine times. There was thus completed the multilayered buffer region $2_f$ consisting of fifty alternations of first buffer layers 8" and second buffer layers 9" in this particular embodiment.

It will be apparent that the modified buffer region $2_f$ is functionally equivalent to the buffer region 2 FIG. 1 in having pn junctions between n-like first layers 8" and p-type second layers 9". Containing boron, moreover, the second buffer layers 9" are sturdier, and can be made thicker without fear of cracking, than in the absence of that element.

Possible Modifications

Notwithstanding the foregoing detailed disclosure it is not desired that the present invention be limited by the exact showings of the drawings or the description thereof. The following is a brief list of possible modifications, alterations or adaptations of the illustrated devices and detailed manufacturing methods thereof according to the invention which are all believed to fall within the purview of the claims annexed hereto:

1. If the main semiconductor region includes a p-type layer next to the buffer region, or is solely of p type, then the underlying buffer layer may be made to have an n-type conductivity, a desired pn junction being created therebetween.

2. In the case where the topmost layer of the buffer region is of p type, the overlying layer of the main semiconductor region may be doped into n type.

3. In any of the illustrated buffer regions 2, $2_a$-$2_f$ the first layers 8, 8' and 8" adjoining the p-type second buffer layers 9, 9' and 9" could be positively doped into n-type.

4. All or some of the second layers of the buffer region could be doped with a p-type impurity in an amount insufficient to convert them into p type. The first buffer layers could be likewise doped with a p-type impurity. The doping of the n-like buffer layers (either second buffer layers only or both first and second buffer layers) with such insufficient amounts of a p-type impurity will not convert them into p type but make them sufficiently electrically resistive to diminish the flow of leakage current therethrough.

5. The present invention is applicable to Schottky barrier diodes, and indeed to all the semiconductor devices in which current flows through the main semiconductor region in its transverse direction.

What is claimed is:

1. A nitride-based semiconductor device of reduced current leakage, the semiconductor device comprising:
   (a) a substrate containing silicon;
   (b) a buffer region of a nitride-based semiconductor on the substrate;
   (c) a main semiconductor region having at least one nitride-based semiconductor layer on the buffer region, said main semiconductor region having a major surface;
   (d) a first and a second main electrode formed in spaced-apart positions on, and in ohmic contact with, the major surface of the main semiconductor region; and
   (e) a control electrode formed between the first and the second main electrode on the major surface of the main semiconductor region for controlling current flow between the first and the second main electrode,
   wherein the buffer region and/or the main semiconductor region are adapted to provide a pn junction for preventing current leakage there-through.

2. A nitride-based semiconductor device as defined in claim 1, wherein the nitride-based semiconductor layer of the main semiconductor region is made from a substance selected from the group consisting of gallium nitride, aluminum indium nitride, aluminum gallium nitride, indium gallium nitride, and aluminum indium gallium nitride.

3. A nitride-based semiconductor device as defined in claim 1, wherein the buffer region is in the form of alternations of a first nitride-based semiconductor layer containing a prescribed proportion of aluminum, and a second nitride-based semiconductor layer containing aluminum in a proportion that is either zero or less than said prescribed proportion.

4. A nitride-based semiconductor device of reduced current leakage, the semiconductor device comprising:
   (a) a substrate containing silicon;
   (b) a buffer region on the substrate;
   (c) a main semiconductor region having at least one nitride-based semiconductor layer on the buffer region, said main semiconductor region having a major surface;
   (d) a first and second main electrode formed in spaced-apart positions on, and in ohmic contact with, the major surface of the main semiconductor region; and
   (e) a control electrode formed between the first and the second main electrode on the major surface of the main semiconductor region for controlling current flow between the first and the second main electrode,
   wherein the buffer region comprises a substantially n-type nitride-based semiconductor region doped with a p-type impurity in at least part thereof.

5. A nitride-based semiconductor device as defined in claim 4, wherein the buffer region is in the form of alternations of a first nitride-based semiconductor layer containing a prescribed proportion of aluminum, and a second nitride-based semiconductor layer containing aluminum in a proportion that is either zero or less than said prescribed proportion.

6. A nitride-based semiconductor device as defined in claim 5, wherein the first layers of the buffer region are fabricated from any of nitrides that are generally defined by the formula:

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one; and wherein the second layers of the buffer region are fabricated from any of nitrides that are generally defined by the formula:

$$Al_aM_bGa_{1-a-b}N$$

where M is at least either of indium and boron; the subscript a is a numeral that is equal to or greater than zero, less than one, and less than x in the formula above generally defining the compositions of the first layers of the buffer region; the subscript b is a numeral that is equal to or greater than zero and less than one; and the sum of a and b is equal to or less than one.

7. A nitride-based semiconductor device as defined in claim 5, wherein the first layers of the buffer region are fabricated from any of nitrides that are generally defined by the formula:

$$Al_xGa_{1-x}N$$

where the subscript x is a numeral that is greater than zero and equal to or less than one; and wherein the second layers of the buffer region are fabricated from any of nitrides that are generally defined by the formula:

$$Al_aGa_{1-a}N$$

where the subscript a is a numeral that is equal to or greater than zero and less than x in the formula above generally defining the compositions of the first layers of the buffer region.

8. A nitride-based semiconductor device as defined in claim 5, wherein the first layers of the buffer region are fabricated from any of nitrides that are generally defined by the formula:

$$Al_xIn_yGa_{1-x-y}N$$

where the subscript x is a numeral that is greater than zero and equal to or less than one; the subscript y is a numeral that is equal to or greater than zero and less than one; and the sum of x and y is equal to or less than one; wherein the second layers of the buffer region are fabricated from any of nitrides that are generally defined by the formula:

$$Al_aIn_bGa_{1-a-b}N$$

where the subscript a is a numeral that is equal to or greater than zero, less than one, and less than x in the formula above generally defining the compositions of the first layers of the buffer region; the subscript b is a numeral that is equal to or greater than zero and less than one; and the sum of a and b is equal to or less than one; and wherein indium is contained in at least either of the first and the second layers of the buffer region.

9. A nitride-based semiconductor device as defined in claim 5, wherein the first layers of the buffer region are fabricated from any of nitrides that are generally defined by the formula:

$$Al_xB_yGa_{1-x-y}N$$

where the subscript x is a numeral that is greater than zero and equal to or less than one; the subscript y is a numeral that is equal to or greater than zero and less than one; and the sum of x and y is equal to or less than one; wherein the second layers of the buffer region are fabricated from any of nitrides that are generally defined by the formula:

$$Al_aB_bGa_{1-a-b}N$$

where the subscript a is a numeral that is equal to or greater than zero, less than one, and less than x in the formula above generally defining the compositions of the first layers of the buffer region; the subscript b is a numeral that is equal to or greater than zero and less than one; and the sum of a and b is equal to or less than one, and wherein boron is contained in at least either of the first and the second layers of the buffer region.

10. A nitride-based semiconductor device as defined in claim 5, wherein the first layers of the buffer region are of a substantially n-type nitride-based semiconductor, and wherein at least one of the second layers of the buffer region is doped with a p-type impurity.

11. A nitride-based semiconductor device as defined in claim 5, wherein the second layers of the buffer region are of a substantially n-type nitride-based semiconductor, and wherein at least one of the first layers of the buffer region is doped with a p-type impurity.

12. A nitride-based semiconductor device as defined in claim 5, wherein all of the first and the second layers of the buffer region are doped with a p-type impurity.

13. A nitride-based semiconductor device as defined in claim 5, wherein the first layers of the buffer region are from about 0.5 nanometer to about 50 nanometers thick, and wherein the second layers of the buffer region are from about 0.5 nanometer to about 200 nanometers thick.

* * * * *